US009111846B1

(12) United States Patent
Whang et al.

(10) Patent No.: US 9,111,846 B1
(45) Date of Patent: Aug. 18, 2015

(54) ASSEMBLY STRUCTURE FOR CONNECTING MULTIPLE DIES INTO A SYSTEM-IN-PACKAGE CHIP AND THE METHOD THEREOF

(71) Applicants: Tsung Chuan Whang, Cupertino, CA (US); Yi-Chieh Wang, Taiching (TW)

(72) Inventors: Tsung Chuan Whang, Cupertino, CA (US); Yi-Chieh Wang, Taiching (TW)

(73) Assignees: Gloval Unichip Corp., Hsinchu (TW); Taiwan Semiconductor Manufacturing Company Ltd., Hsinchu (TW)

( * ) Notice: Subject to any disclaimer, the term of this patent is extended or adjusted under 35 U.S.C. 154(b) by 0 days.

(21) Appl. No.: 14/253,868

(22) Filed: Apr. 16, 2014

(51) Int. Cl.
*H01L 23/48* (2006.01)
*H01L 25/18* (2006.01)
*H01L 25/00* (2006.01)
*H01L 23/00* (2006.01)
*H01L 27/02* (2006.01)

(52) U.S. Cl.
CPC .............. *H01L 25/18* (2013.01); *H01L 24/09* (2013.01); *H01L 24/49* (2013.01); *H01L 24/85* (2013.01); *H01L 25/50* (2013.01); *H01L 27/0255* (2013.01); *H01L 2224/0231* (2013.01); *H01L 2224/0237* (2013.01); *H01L 2224/04042* (2013.01); *H01L 2224/48145* (2013.01); *H01L 2924/1203* (2013.01); *H01L 2924/1207* (2013.01); *H01L 2924/13091* (2013.01); *H01L 2924/141* (2013.01); *H01L 2924/143* (2013.01)

(58) Field of Classification Search
USPC .......................................................... 257/777
See application file for complete search history.

(56) References Cited

U.S. PATENT DOCUMENTS

| 7,863,723 B2 * | 1/2011 | Oh et al. ................. 257/686 |
| 2003/0122240 A1 * | 7/2003 | Lin et al. ................. 257/686 |
| 2013/0069163 A1 * | 3/2013 | Bhalla et al. ............. 257/368 |
| 2013/0277794 A1 * | 10/2013 | Yen et al. ................. 257/503 |

* cited by examiner

*Primary Examiner* — Thao P Le
(74) *Attorney, Agent, or Firm* — Min-Lee Teng; Litron Patent & Trademark Office

(57) ABSTRACT

The present invention discloses an efficient way to connect multiple integrated circuit dies using redistribution layers (RDL) for making wire connections. Antenna diodes are used to create ground paths so as to remove non-sticking pads on the RDL to ensure the integrity of the wire connections before packaging the multiple integrated circuit dies into a system-in-package (SIP) chip, thereby eliminating unnecessary yield loss in a functional test caused by the non-sticking pads. In another aspect, electrostatic discharge (ESD) protection can be provided through the antenna diodes across two different power domains by disposing a diode in one integrated circuit die for ESD protection of a terminal in another integrated circuit die.

15 Claims, 3 Drawing Sheets

ASSEMBLY STRUCTURE FOR CONNECTING MULTIPLE DIES INTO A SYSTEM-IN-PACKAGE CHIP AND THE METHOD THEREOF

BACKGROUND OF THE INVENTION

1. Field of the Invention

The present invention relates generally to a system-in-package chip, and more particularly to an assembly structure for packaging the system-in-package chip.

2. Description of the Prior Art

As technology continues improving, gate count density keeps increasing and the form factor keeps getting smaller. Integration of all analog, digital and memory chips in a package is essential. SIP (System in Package) is one solution to resolve this complex issue. However, putting many chips in one package is not a trivial task. The assembly house needs to deal with wire bonding issues if the chip was not designed properly, which will cause non-stick bonding pad issues.

Conventionally, a package substrate is used for making electrical connections among integrated circuit silicon dies, wherein wire connections are formed between pads in the integrated circuit silicon dies and contact leads in the package substrate. A non-stick on pad (NSOP) test can then be performed on each of the pads in order to detect non-stick failures. A NSOP test is performed by sending a testing signal from a DC/AC BITS board in a bond integrity test system (BITS) through a BITS Cable to the pads and detecting a current loop from each of the pads to the ground. If there is anything in between to block the current loop, the NSOP test will fail.

As shown in FIG. 1A, a die is placed on a package substrate under which a heat block is disposed, wherein the heat block is connected to ground for performing a wire bonding test by a bond integrity test system (BITS). The BITS will send BITS test signals to the pad through a probe which is in contact with a pad on the die in order to test the continuity of the pad. When a BITS signal carries a DC voltage, the BITS test signal will be conducted through the die and the substrate to the ground; therefore. a separated ground connection is not needed for conducting the pad to the ground because a conductive path is from the pad to the ground through the die and the substrate. That is, there must be a conductive path from the pad to the ground to ensure the continuity of the pad; otherwise the pad will be called a non-stick or floating pad, and the continuity test of the pad will fail.

In another aspect of the conventional technology, a package substrate for connecting the pads of the integrated circuit dies to external leads is always present in order to connect multiple integrated circuit dies, which adds cost.

Therefore, what is needed is an efficient way to connect multiple integrated circuit dies for a system-in-package chip.

SUMMARY OF THE INVENTION

The present invention provides an efficient way to connect multiple integrated circuit dies using redistribution layers (RDL) for making wire connections.

In one embodiment of the present invention, antenna diodes are used to create ground paths to remove non-sticking or floating pads on the RDL to ensure the integrity of the wire connections before packaging the multiple integrated circuit dies into a system-in-package (SIP) chip, thereby eliminating unnecessary yield loss in a functional test caused by the non-sticking pads.

In another aspect of the present invention, electrostatic discharge (ESD) protection can be provided through the antenna diodes across two different power domains by disposing a diode in one integrated circuit die for ESD protection of a terminal in another integrated circuit die.

In one embodiment, an assembly structure for electrically connecting multiple integrated circuit dies is disclosed, wherein the assembly structure comprises: a first integrated circuit die and a second integrated circuit die; an interconnect redistribution layer disposed on the first integrated circuit die, wherein the interconnect redistribution layer comprises a first pad thereon for electrically connecting the first integrated circuit die and the second integrated circuit die, wherein the first integrated circuit die has a first substrate therein; wherein the first integrated circuit die comprises a first conductive element for forming a conductive path between the first pad and the first substrate of the first integrated circuit die, wherein the first pad is a floating pad to the first integrated circuit die when the first conductive element is not present in the first integrated circuit die.

In one embodiment, the first substrate is p-type and the diode is disposed by creating an n-type region underneath the corresponding pad of the at least one pad and the interconnect redistribution layer in the first substrate to form a p-n junction between the p-type substrate and the n-type region, wherein the n-type region is electrically connected to the corresponding pad of the at least one pad.

In one embodiment, the second integrated circuit die is disposed on the first integrated circuit die through an isolation layer, wherein the at least one pad is electrically connected to the second integrated circuit die by wire bonding.

In one embodiment, there is no substrate underneath the first integrated circuit die and the second integrated circuit die for connecting the first integrated circuit die and the second integrated circuit die.

In one embodiment, the first integrated circuit die and the second integrated circuit die are packaged into a system-in-package chip.

In one embodiment, a method for assembling multiple integrated circuit dies into a system-in-package chip is disclosed, wherein the method comprises: providing a plurality of integrated circuit dies; disposing at least one interconnect redistribution layer on at least one of the plurality of integrated circuit dies for making wire connections among the plurality of integrated circuit dies without using a substrate underneath the plurality of integrated circuit dies; establishing a plurality of wire connections among the plurality of integrated circuit dies and verifying the plurality of wire connections; and packaging the plurality of integrated circuit dies into a system-in-package chip.

In one embodiment, the method further comprising disposing a diode in the first integrated circuit die to remove a floating pad on an interconnect redistribution layer, wherein the negative terminal of the diode is electrically connected to the floating pad and the positive terminal of the diode is electrically connected to a first substrate of the first integrated circuit die.

In one embodiment, wherein the first substrate is p-type and the diode is disposed by creating an n-type region underneath the floating pad in the first substrate to form a p-n junction between the p-type substrate and the n-type region, wherein the n-type region is electrically connected to the floating pad.

In one embodiment, a second integrated circuit die is disposed on the first integrated circuit die through an isolation layer, wherein the floating pad is electrically connected to a terminal of the second integrated circuit die by wire bonding.

In one embodiment, a system-in-package chip with multiple integrated circuit dies is disclosed, wherein the system-in-package chip comprises: a first integrated circuit die and a second integrated die, wherein the first integrated circuit die comprises a first terminal electrically connected to a second terminal of a second integrated die; a diode disposed in the first integrated circuit die, wherein a positive terminal of the diode is electrically connected to first terminal and a negative terminal of the diode is electrically connected to a first substrate of the first integrated circuit die, wherein the second terminal of the second integrated circuit die uses the diode of the first integrated circuit die for electrostatic discharge (ESD) protection.

In one embodiment, the first substrate is p-type and the diode is disposed by creating an n-type region underneath the first terminal in the first substrate to form a p-n junction between the p-type substrate and the n-type region, wherein the n-type region is electrically connected to the first terminal.

In one embodiment, the first integrated circuit die and the second integrated circuit die are in two different power domains.

BRIEF DESCRIPTION OF DRAWINGS

The foregoing aspects and many of the accompanying advantages of this invention will become more readily appreciated as the same becomes better understood by reference to the following detailed description, when taken in conjunction with the accompanying drawings, wherein.

DETAILED DESCRIPTION OF EMBODIMENT

The detailed explanation of the present invention is described as following. The described preferred embodiments are presented for purposes of illustrations and description, and they are not intended to limit the scope of the present invention.

Figure 1:
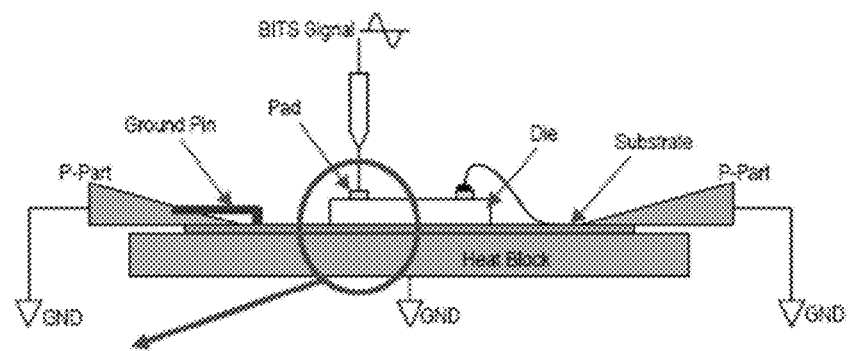
FIG. 1 illustrates a conventional assembly structure of multiple integrated circuit dies.
Figure 2:
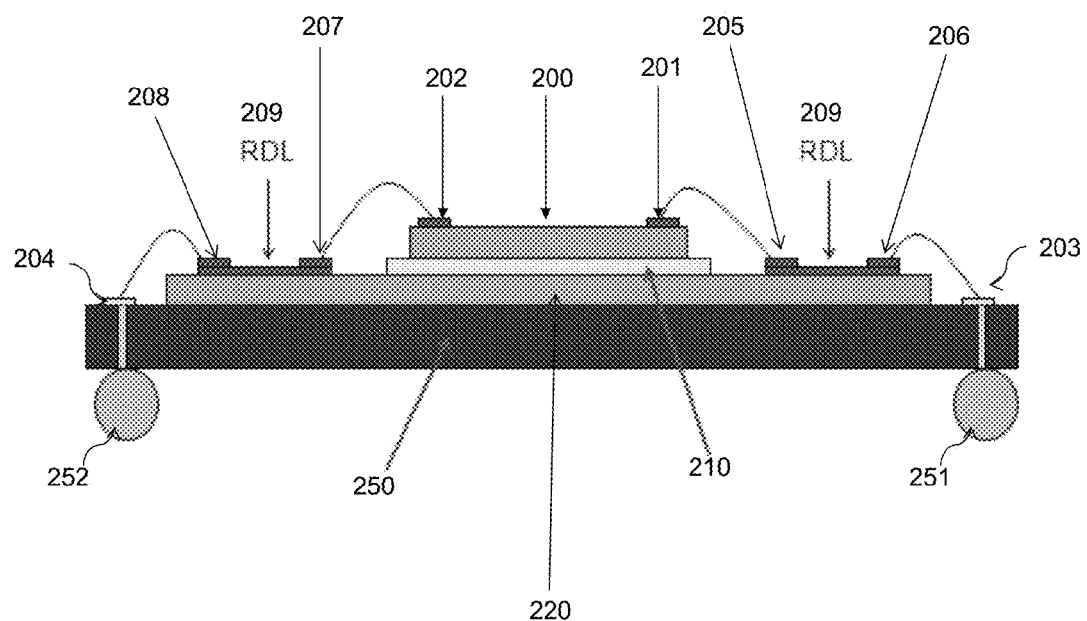
FIG. 2 illustrates an assembly structure of multiple integrated circuit dies in accordance with one embodiment of the present invention.

FIG. 2 shows a multi-die assembly structure by using a redistribution layer (RDL) as a bridge for wire connection without using a substrate underneath the multiple dies. A first integrated circuit die 200, which comprises mainly analog circuits stacking on a second integrated circuit die 220, which comprises mainly digital circuits, wherein an isolation layer 210 is disposed between the first integrated circuit die 200 and the second integrated circuit die 220 so that the analog circuits can be completely isolated from the digital circuits to achieve high performance when they are packaged into a system-in-package (SIP) chip. There is a redistribution layer 209 (RDL) on the second integrated circuit die 220 to connect terminals of the second integrated circuit die 220 to external leads, wherein a first pad 205 and a second pad 206 are used to connect a first terminal 201 of the first integrated circuit die 200 to a first lead 203; a third pad 207 and a fourth pad 208 are used to connect a second terminal 202 of the second integrated circuit die 220 to a second lead 204. However, RDL 209 pads 205, 206, 207, 208 are now floating because the pad on the RDL 209 is not connected to any circuit in the second integrated circuit die 220 while the first integrated circuit die 200 is isolated completely by the isolation layer 210, and it is found during an assembly stage in which wire bonding is performed through the RDL. During wire bonding assembly, the tester cannot detect the pad 205, 206, 207, 208 since they are floating pads and not connected to the circuits of the first integrated circuit die 200. In this scenario, a package substrate is not used to connect the first integrated circuit die 200 and the second integrated circuit die 220 due to the fact that the analog circuits require to be completely isolated from the digital circuit as mentioned above. Consequently, the assembly house is not able to ensure the quality of the system-in-package (SIP) chip after the first integrated circuit die 200 and the second integrated circuit die 220 are assembled; and an error in the assembled SIP chip can only be detected at a functional test stage, which is costly and might impact the yield rate because a chip failed in the functional test stage can be mixed with errors caused by the wire bonding inside the SIP chip; and fixing the functionality of the SIP chip is much difficult and expensive than fixing the wire bonding of the SIP chip.

In order to resolve this floating pad issue, in one embodiment of the present invention an antenna diode is disposed in the second integrated circuit die 220 under the floating pad so as to create a ground path for sensing, wherein the antenna diode is not connected to any other circuit in the second integrated circuit die 220; and it is not necessary for the original circuit design inside the second integrated circuit die 220 in the first place. It is a simple, easy and costless solution to resolve non-sticking pad assembly issues by using the antenna diode disposed in the second integrated circuit die 220 for making connections to the terminals of the first integrated circuit die 200, thereby eliminating yield loss during the functional test.

Figure 3:
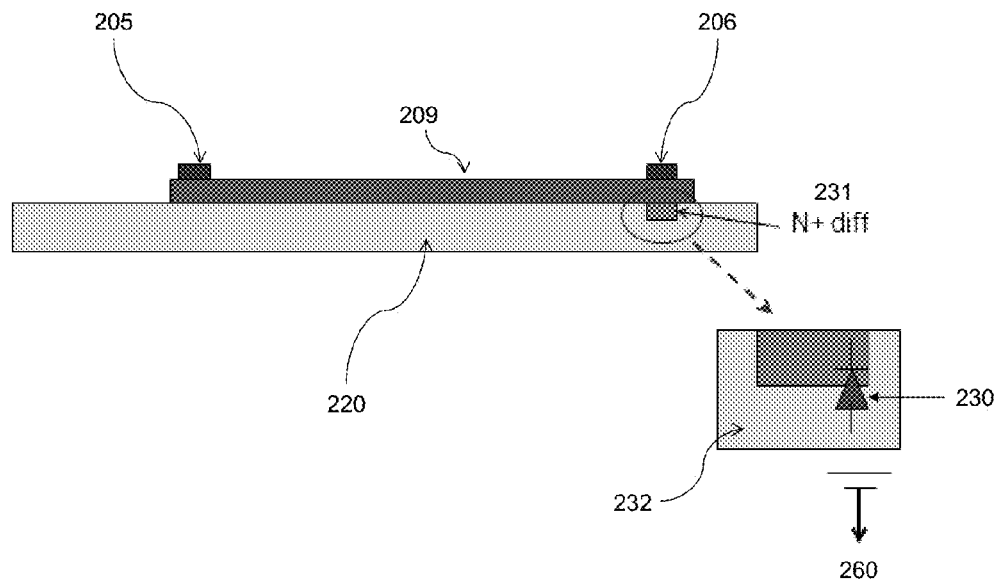
FIG. 3 illustrates antenna diodes disposed in an integrated circuit die to remove floating pads in accordance with one embodiment of the present invention.

In one embodiment, as shown in FIG. 3, a diode 231 is formed by adding a small N+ diffusion 231 underneath the second pad 206 in the first substrate to form a P/N diode between the floating pad 206 and the substrate 232 of the second integrated circuit die 220 which creates a path to ground without any leakage concern. By doing so, the non-stick bonding pad issue can be resolved. After the wire boding inside the SIP chip is completed and verified, the first integrated circuit die 200 and the second integrated circuit die 220 are packaged into a chip. In one embodiment, the floating pads 205, 206 on the RDL 209 are electrically connected to a ball pin 251 through a pad 203 on a package 250 and the floating pads 207, 208 on the RDL 209 are electrically connected to a ball pin 252 through a pad 204 on the package 250.

Please note that other conductive elements can be disposed instead of the diode to resolve the floating pad or non-stick pad. For example, a resistor with high impedance or a NMOS transistor of which the drain is connected to the floating pad, and the source, gate of the NMOS transistor are connected to the substrate of the second integrated circuit die 220, as long as the current flowing through the conductive element is small enough without impacting normal operation of the SIP chip.

In one embodiment, the diode 230 is used for creating an electrostatic discharge (ESD) path to protect the first integrated circuit die. The ESD includes charged-device model types.

In one embodiment, the second integrated circuit die is mainly based on digital circuit designs such as a baseband design, and the first integrated circuit die is mainly based on analog designs, such as an ADC/DAC/PLL design.

Figure 4:
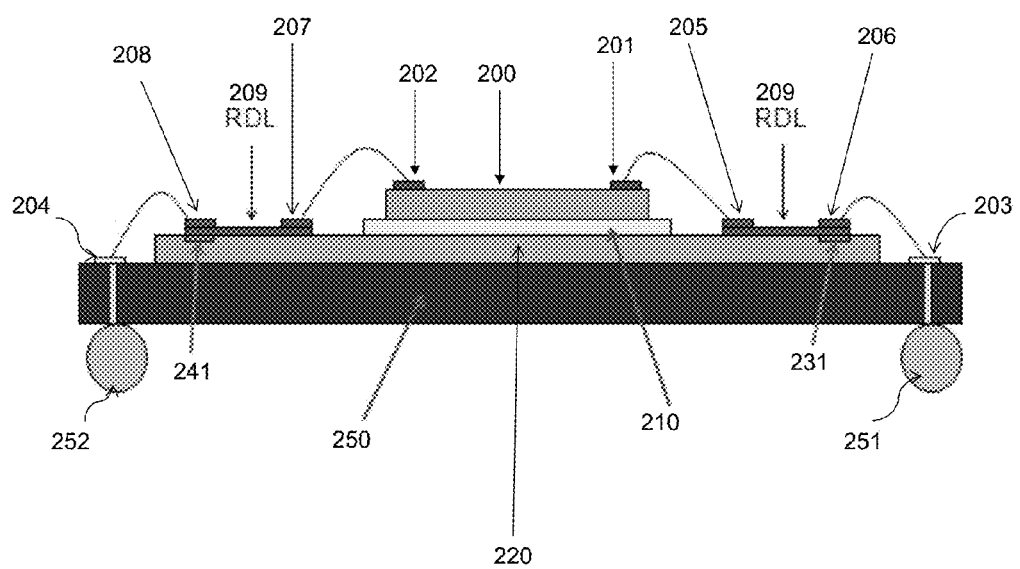
FIG. 4 illustrates a complete assembly structure of multiple integrated circuit dies without floating pads in accordance with one embodiment of the present invention.

FIG. 4 illustrates a complete assembly structure of the SIP chip in one embodiment of the present invention, wherein one diode is formed by adding a small N+ diffusion 231 underneath the floating pad 206 in the first substrate to form a P/N diode between the floating pad 206 and the substrate 232 of the second integrated circuit die 220; another diode is formed by adding a small N+ diffusion 241 underneath the floating pad 208 in the first substrate to form another P/N diode between the floating pad 208 and the substrate 232 of the second integrated circuit die 220, wherein the floating pads 206 is electrically connected to a ball pin 251 through a pad 203 on a package 250 and the floating pads 208 is electrically connected to a ball pin 252 through a pad 204 on the package 250. Please note that there are many ways to place the integrated circuit dies, for example, there is a third integrated die (not shown), which has a substrate for connecting to a ground and is located on one side of the first integrated circuit die, on which another RDL is disposed, and said another RDL can be used to connect other terminals of the second integrated die as well. That is, when there is a floating pad on a redistribution layer disposed on an integrated circuit die, the integrated circuit die can provide a conductive path for the floating pad to resolve the floating pad issue during assembly stage, so that the functional test can focus on functionality of the SIP chip without worrying about the floating pad issues at all.

In one embodiment, a system-in-package chip with multiple integrated circuit dies is disclosed, wherein the system-in-package chip comprises: a first integrated circuit die and a second integrated die, wherein the first integrated circuit die comprises a first terminal electrically connected to a second terminal of a second integrated die, wherein the first integrated circuit die has a first substrate; wherein the first integrated circuit die comprises a diode, wherein a positive terminal of the diode is electrically connected to the first terminal and a negative terminal of the diode is electrically connected to the first substrate of the first integrated circuit die, wherein the second terminal of the second integrated circuit die uses the diode of the first integrated circuit die for electrostatic discharge (ESD) protection.

Please refer to FIG. 4 again, the diode formed by N+ diffusion 231 and the diode formed by N+ diffusion 241 are used to provide electrostatic discharge (ESD), such as charged-device model (CDM) ESD, for the terminals 201, 202 of the second integrated circuit die, respectively. In this embodiment, the pad 206 and pad 208 are not necessarily floating and the first integrated circuit die 200 and the integrated circuit die 220 can be in different power domains. In one embodiment, the first substrate is p-type and the diode is disposed by creating an n-type region in the p-type substrate to form a p-n junction between the p-type substrate and the n-type region, wherein the n-type region is electrically connected to the first terminal of the first integrated circuit die In one embodiment, the second integrated circuit die is disposed over the first integrated circuit die through an isolation layer, wherein a redistribution layer is disposed on the first integrated circuit die, wherein the redistribution layer comprises a first pad thereon for electrically connecting the first terminal of the first integrated circuit die and the second terminal of the second integrated circuit die.

Figure 5:
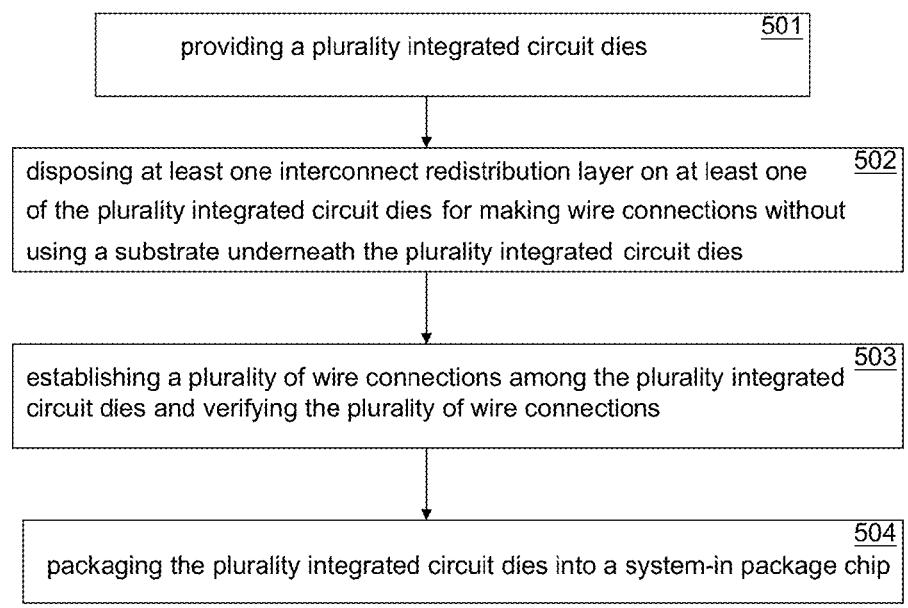
FIG. 5 shows a flow chart of a method for assembling multiple integrated circuit dies into a system-in-package chip in accordance with one embodiment of the present invention.

FIG. 5 shows a flow chart of a method for assembling multiple integrated circuit dies into a system-in-package chip in accordance with one embodiment of the present invention, wherein the method comprises the steps of: (step 501) providing a plurality of integrated circuit dies; (step 502) disposing at least one interconnect redistribution layer on at least one of the plurality of integrated circuit dies for making wire connections among the plurality of integrated circuit dies without using a substrate underneath the plurality of integrated circuit dies; (step 503) establishing a plurality of wire connections among the plurality of integrated circuit dies and verifying the plurality of wire connections; and (step 504) packaging the plurality of integrated circuit dies into a system-in-package chip after the plurality of wire connections are verified correctly.

In one embodiment, at least one interconnect redistribution layer comprises a first interconnect redistribution layer disposed on a first integrated die with at least one pad thereon for connecting to a second integrated circuit die, wherein step 502 further comprising disposing a diode underneath each of the at least one pad in the first integrated circuit die, wherein a negative terminal of the diode is electrically connected to a corresponding pad of the at least one pad on the first interconnect redistribution layer for connecting to the second integrated circuit die and a positive terminal of the diode is electrically connected to the first substrate of the first integrated circuit die for connecting to a ground node.

In one embodiment, the first substrate is p-type and the diode is disposed by creating an n-type region underneath the corresponding pad of the at least one pad and the interconnect redistribution layer in the first substrate to form a p-n junction between the p-type substrate and the n-type region, wherein the n-type region is electrically connected to the corresponding pad of the at least one pad.

Other descriptions of the method can be easily understood by referring FIG. 2 to FIG. 4; therefore, they are not described further herein.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the claims appended hereto and their equivalents.

The invention claimed is:

1. An assembly structure for electrically connecting multiple integrated circuit dies, comprising:
   a first integrated circuit die and a second integrated circuit die; and
   a redistribution layer disposed on the first integrated circuit die, wherein the redistribution layer comprises a first pad thereon for electrically connecting the first integrated circuit die and the second integrated circuit die, wherein the first integrated circuit die has a first substrate therein;
   wherein the first integrated circuit die comprises a first conductive element for forming a conductive path between the first pad and the first substrate of the first integrated circuit die, wherein the first pad is a floating pad when the first conductive element is not present in the first integrated circuit die.

2. The circuit according to claim 1, wherein the first conductive element is a diode, wherein the negative terminal of the diode is electrically connected to the first pad and the positive terminal of the diode is electrically connected to the first substrate.

3. The circuit according to claim 2, wherein the first substrate is p-type and the diode is disposed by creating an n-type region in the first substrate to form a p-n junction between the p-type substrate and the n-type region, wherein the n-type region is electrically connected to the first pad.

4. The circuit according to claim 1, wherein the first conductive element is a resistor with high impedance, wherein one end of the resistor is electrically connected to the first pad and the other end of the resistor is electrically connected to the first substrate.

5. The circuit according to claim 1, wherein the first conductive element is a NMOS transistor, wherein a drain terminal of the NMOS transistor is electrically connected to the first pad, and a source terminal and a gate terminal of the NMOS transistor are electrically connected to the first substrate.

6. The circuit according to claim 1, wherein there is no substrate underneath the first integrated circuit die for electrically connecting the first integrated circuit die and the second integrated circuit die.

7. The circuit according to claim 1, wherein the second integrated circuit die is disposed on the first integrated circuit die through an isolation layer, wherein the first pad is electrically connected to a first terminal of the second integrated circuit die by wire bonding.

8. The circuit according to claim 7, wherein the first integrated circuit die comprises mainly digital circuits and the second integrated circuit die comprises mainly analog circuits.

9. The circuit according to claim 7, wherein the first pad is used for electrically connecting the first terminal of the second integrated circuit die to an external lead.

10. The circuit according to claim 7, wherein the first terminal of the second integrated circuit die uses the diode of the first integrated circuit for electrostatic discharge (ESD) protection.

11. A system-in-package chip comprising an assembly structure recited as in claim 1.

12. A system-in-package chip with multiple integrated circuit dies, comprising:
a first integrated circuit die and a second integrated die, wherein the first integrated circuit die comprises a first terminal electrically connected to a second terminal of a second integrated die, wherein the first integrated circuit die has a first substrate therein;
wherein the first integrated circuit die comprises a diode, wherein a positive terminal of the diode is electrically connected to the first terminal and a negative terminal of the diode is electrically connected to the first substrate of the first integrated circuit die, wherein the second terminal of the second integrated circuit die uses the diode of the first integrated circuit die for electrostatic discharge (ESD) protection.

13. The system-in-package chip according to claim 12, wherein the first substrate is p-type and the diode is disposed by creating an n-type region in the p-type substrate to form a p-n junction between the p-type substrate and the n-type region, wherein the n-type region is electrically connected to the first terminal of the first integrated circuit die.

14. The system-in-package chip according to claim 13, wherein the first integrated circuit die and the second integrated circuit die are in two different power domains.

15. The system-in-package chip according to claim 13, wherein the second integrated circuit die is disposed over the first integrated circuit die through an isolation layer, wherein a redistribution layer is disposed on the first integrated circuit die, wherein the redistribution layer comprises a first pad thereon for electrically connecting the first terminal of the first integrated circuit die and the second terminal of the second integrated circuit die.

\* \* \* \* \*